United States Patent
Xin et al.

(10) Patent No.: US 10,868,636 B2
(45) Date of Patent: Dec. 15, 2020

(54) MCS FOR LONG LDPC CODES

(71) Applicants: Yan Xin, Ottawa (CA); Min Yan, Shenzhen (CN)

(72) Inventors: Yan Xin, Ottawa (CA); Min Yan, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/563,176

(22) Filed: Sep. 6, 2019

(65) Prior Publication Data

US 2019/0393977 A1    Dec. 26, 2019

Related U.S. Application Data

(63) Continuation of application No. PCT/CN2017/076042, filed on Mar. 9, 2017.

(51) Int. Cl.
*H04L 1/00* (2006.01)
*H03M 13/11* (2006.01)
(Continued)

(52) U.S. Cl.
CPC ....... *H04L 1/0008* (2013.01); *H03M 13/1148* (2013.01); *H03M 13/2906* (2013.01);
(Continued)

(58) Field of Classification Search
CPC ... H04L 1/0008; H04L 5/0007; H04L 1/0057; H04L 27/2601; H03M 13/2906; H03M 13/1148
See application file for complete search history.

(56) References Cited

U.S. PATENT DOCUMENTS 8,495,450 B2 * 7/2013 Abu-Surra .......... H03M 13/033
                                                714/752
2010/0111145 A1 * 5/2010 Trachewsky .......... H04L 1/0041
                                                375/220
(Continued)

FOREIGN PATENT DOCUMENTS

CN        105811997 A    7/2016
CN        105812107 A    7/2016
(Continued)

OTHER PUBLICATIONS

Christopher Hansen (Broadcom): "BRP Comment Resolution for CID 125 ; 11-11-0078-00-00ad-brp-comment-resolution-for-cid-125", IEEE 802.11-11/0078r0, vol. 802. 11 ad, Jan. 16, 2011 (Jan. 16, 2011), pp. 1-7, XP017675538.
(Continued)

*Primary Examiner* — Jean B Corrielus

(57) ABSTRACT

Methods and devices are disclosed for encoding source words and decoding codewords with LDPC matrices. Example embodiments of a modulation and coding scheme (MCS) for generating a rate 1/2 length 1344 LDPC codeword are described. The method includes segmenting a stream of data bits into 336 bit size segments, adding 336 padding bits to each 336 bit size segment to generate corresponding 672 bit size source words, applying a 1/2 rate low density parity check (LDPC) coding to each 672 bit size source word to generate a corresponding 1344 bit size codeword that includes 672 parity bits; and for each codeword, substituting the 336 padding bits with 336 bits derived from the data bits included in the codeword, to provide a 1344 bit size codeword that includes a concatenation of the 336 data bits, the 336 bits derived from the data bits, and 672 parity bits.

18 Claims, 6 Drawing Sheets

(51) Int. Cl.
  *H03M 13/29* (2006.01)
  *H04L 5/00* (2006.01)
  *H04L 27/26* (2006.01)
(52) U.S. Cl.
  CPC .......... *H04L 1/0057* (2013.01); *H04L 5/0007* (2013.01); *H04L 27/2601* (2013.01)

(56) References Cited

U.S. PATENT DOCUMENTS

| | | | |
|---|---|---|---|
| 2010/0131818 | A1 | 5/2010 | Zhou et al. |
| 2013/0257634 | A1 | 10/2013 | Wang et al. |
| 2015/0012803 | A1 | 1/2015 | Jeong et al. |
| 2015/0282183 | A1* | 10/2015 | Sverdlov ........... H04L 25/03866 370/329 |
| 2016/0241314 | A1 | 8/2016 | Ferrante et al. |
| 2017/0134050 | A1* | 5/2017 | Abu-Surra ........... H04B 7/0413 |
| 2017/0134126 | A1* | 5/2017 | Sanderovich ......... H04L 5/0044 |
| 2017/0366299 | A1 | 12/2017 | Li et al. |
| 2019/0222229 | A1* | 7/2019 | Montorsi ........... H03M 13/1185 |

FOREIGN PATENT DOCUMENTS

| | | |
|---|---|---|
| CN | 105991227 A | 10/2016 |
| EP | 2214317 A1 | 8/2010 |
| RU | 2365035 C1 | 8/2009 |
| WO | 2009026798 A1 | 3/2009 |

OTHER PUBLICATIONS

Artyom Lomayev (INTEL): "MIMO Coding for SC PHY in 11ay; 11-17-0211-01-00ay-mimo-coding-for-sc-phy-in-11ay", IEEE 802.11-17/0211r1, vol. 802. 11ay, No. 1 Feb. 13, 2017 (Feb. 13, 2017), pp. 1-11 , XP068112663.

IEEE Std 802.11ad—2012: Amendment 3: Enhancements for Very High Throughput in the 60 GHz Band.

IEEE 802.11/16-0676-01-00ay-length-1344-ldpc-codes-for-11ay, May 2016.

* cited by examiner

FIG. 5

MCS FOR LONG LDPC CODES

RELATED APPLICATIONS

This is a continuation of, and claims priority to and benefit of, International Application No. PCT/CN2017/076042 filed Mar. 9, 2017, the contents of which are incorporated herein by reference.

TECHNICAL FIELD

The present application relates to mobile air interface technologies, in particular to modulation and coding schemes (MCSs) for use with long binary low density parity check (LDPC) codes.

BACKGROUND

An LDPC encoder at a transmitter is used for encoding source words to generate codewords. An LDPC decoder at a receiver is used for decoding the received codewords. LDPC codes of various rates have been adopted in the IEEE 802.11ad standard and are currently proposed in respect of the developing IEEE 802.11ay standard. Long LDPC codes that have a codeword size of 1344 bits have been proposed in "IEEE 802.11-16/0676-01-00 'Length-1344-LDPC-codes-for-11ay', 2016 May 17" [REF 1].

However, the use of a longer LDPC codeword length can impact the modulation and encoding scheme (MCS) used during LDPC encoding at the transmitter and the corresponding decoding processes at the receiver. Accordingly, the change in LDPC codeword length can require modification of the MCS used to generate an LDPC codeword. Section 21.6.3.2.3.3 of "IEEE Std 802.11ad-2012: Amendment 3: Enhancements for Very High Throughput in the 60 GHz Band" [REF 2] describes an encoding scheme for use with a short LDPC code (size=672 bits). However, such a scheme may not be appropriate for a long LDPC code, such as an LDPC code having a codeword size of 1344 bits.

Thus, there is a need for an MCS suitable for use with a long LDPC code.

SUMMARY

Example embodiments of a modulation and coding scheme (MCS) for generating a rate 1/2 length 1344 LDPC codeword are described.

According to an example aspect, a method is provided for encoding a source word for transmission, comprising: segmenting a stream of data bits into 336 bit size segments; adding 336 padding bits to each 336 bit size segment to generate corresponding 672 bit size source words; applying a rate 1/2 low density parity check (LDPC) coding to each 672 bit size source word to generate a corresponding 1344 bit size codeword that includes 672 parity bits; and for each codeword, substituting the 336 padding bits with 336 bits derived from the data bits included in the codeword, to provide a 1344 bit size codeword that includes a concatenation of the 336 data bits, the 336 bits derived from the data bits, and 672 parity bits.

The stream of data bits can be scrambled, and the method can include scrambling the 336 padding bits in the 672 bit size source words before applying the LDPC coding to the 672 bit size source words. In some examples, the padding bits are zero bits. In some examples, applying low LDPC coding to each 672 bit size source word comprises applying the rate 1/2 length 1344 LDPC matrix specified in "IEEE 802.11-16/0676-01-00 'Length-1344-LDPC-codes-for-11ay', 2016 May 17". In some examples, substituting the 336 padding bits comprises replacing each padding bit with a data bit that has been XORed with a bit from a PN sequence. In some examples, the codewords are mapped to BPSK symbols. In some examples, the BPSK symbols are blocked into data blocks or orthogonal frequency division multiplexing (OFDM) symbol blocks and the data blocks or OFDM symbol blocks are assembled into an 802.11ay compliant frame for transmission using single carrier or OFDM respectively.

According to an example embodiment a system is provided for encoding a source word for transmission, comprising a segmentation module configured to: segment a stream of data bits into 336 bit size segments; and add 336 padding bits to each 336 bit size segment to generate corresponding 672 bit size source words. The system includes a low density parity check (LDPC) coding module configured to: encode each 672 bit size source word to generate a corresponding 1344 bit size codeword that includes 672 parity bits; and for each codeword, substitute the 336 padding bits with 336 bits derived from the data bits included in the codeword, to provide a 1344 bit size codeword that includes a concatenation of the 336 data bits, the 336 bits derived from the data bits, and 672 parity bits.

BRIEF DESCRIPTION OF THE DRAWINGS

Reference will now be made, by way of example, to the accompanying figures which show example embodiments of the present application, and in which:

FIG. 5 shows a lifting matrix and a Rate 1/2 LDPC code specified in IEEE802.11ad with codeword length of 672.

Like reference numerals are used throughout the Figures to denote similar elements and features. While aspects of the invention will be described in conjunction with the illustrated embodiments, it will be understood that it is not intended to limit the invention to such embodiments.

DETAILED DESCRIPTION OF EXAMPLE EMBODIMENTS

The present disclosure teaches methods, devices, and systems and in particular a modulation and coding scheme for encoding source words to generate codewords that are transmitted in a wireless network such as a wireless local area network (WLAN). While described below primarily with respect to 802.11ay compatible networks, the present disclosure may also be applied to other blocking coding based systems.

Figure 1A:
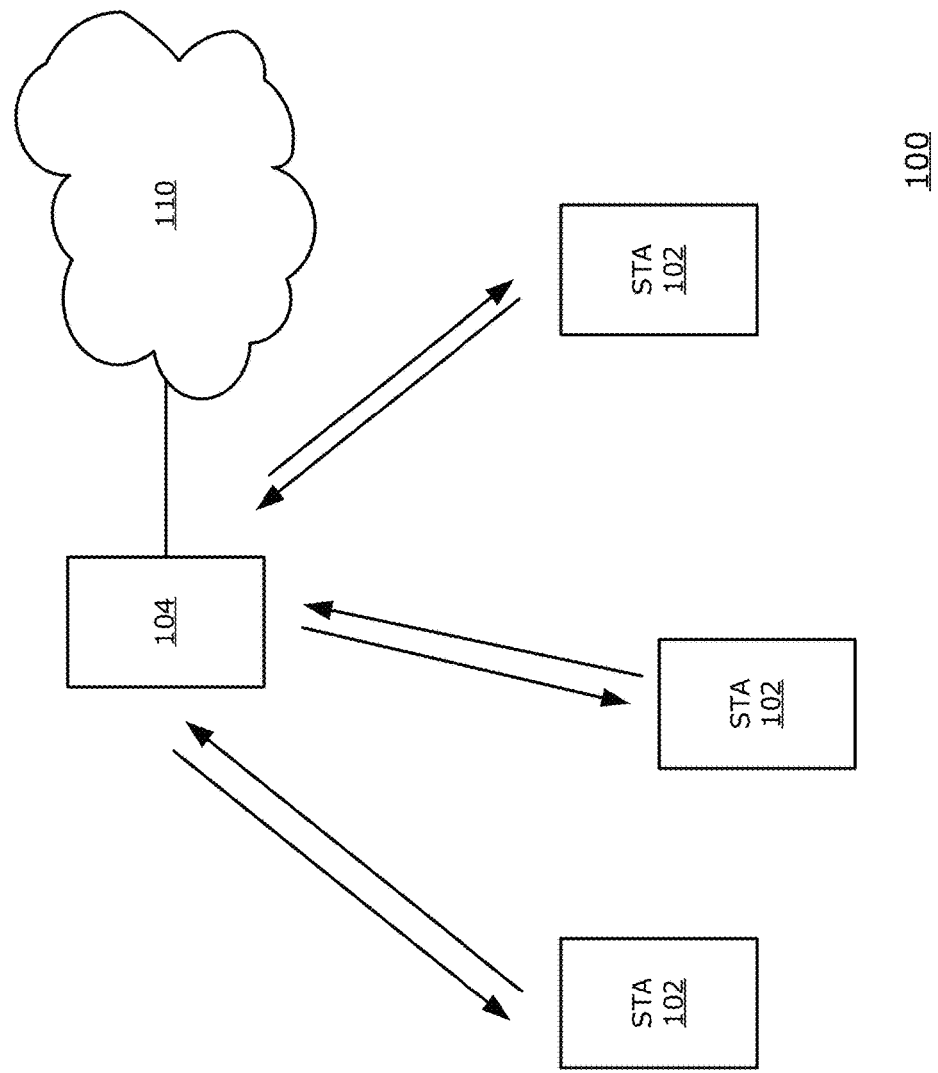
FIG. 1A is a block diagram illustrating an example communications system in accordance with one implementation of the present disclosure.

An example of an environment in which the LDPC coding systems described in detail below can operate will be provided with reference to FIGS. 1A and 1B. FIG. 1A illustrates a communications network 100 comprising a plurality of stations (STAs) 102 and an access point (AP) 104. Each of the STA 102 and AP 104 may include a transmitter, a receiver, an encoder, and/or a decoder as described herein. The network 100 may operate according to one or more communications or data standards or technologies including but not limited to IEEE 802.11 networks, fifth generation (5G) or fourth generation (4G) telecommunications networks, Long-Term Evolution (LTE), 3rd Generation Partnership Project (3GPP), Universal Mobile Telecommunications System (UMTS) and other wireless or mobile communications networks. The network 100 may for example be a wireless local area network (WLAN). The STA 102 generally can be any device capable of providing wireless communications or using the 802.11 protocol. The STA 102 may be a laptop, a desktop PC, PDA, access point or Wi-Fi phone, wireless transmit/receive unit (WTRU), mobile station (MS), mobile terminal, smartphone, cellular telephone, or other wireless enabled computing or mobile device. In some embodiments, the STA 102 comprises a machine which has the capability to send, receive, or send and receive data in the communications network 100 but which performs primary functions other than communications. In one embodiment, a machine includes an apparatus or device with means to transmit and/or receive data through the communications network 100 but such apparatus or device is not typically operated by a user for the primary purpose of communications. The AP 104 may comprise a base station (BS), evolved Node B (eNB), wireless router, or other network interface, which functions as a wireless transmission and/or reception point for STA 102 in the network 100. The AP 104 is connected to a backhaul network 110 which enables data to be exchanged between the AP 104 and other remote networks, nodes, APs, and devices (not shown). The AP 104 may support communications with each STA 102 by establishing uplink and downlink communications channels with each STA 102, as represented by the arrows in FIG. 1A. Communications in the network 100 may be unscheduled, scheduled by the AP 104 or by a scheduling or management entity (not shown) in the network 100, or a mix of scheduled and unscheduled communications.

Figure 1B:
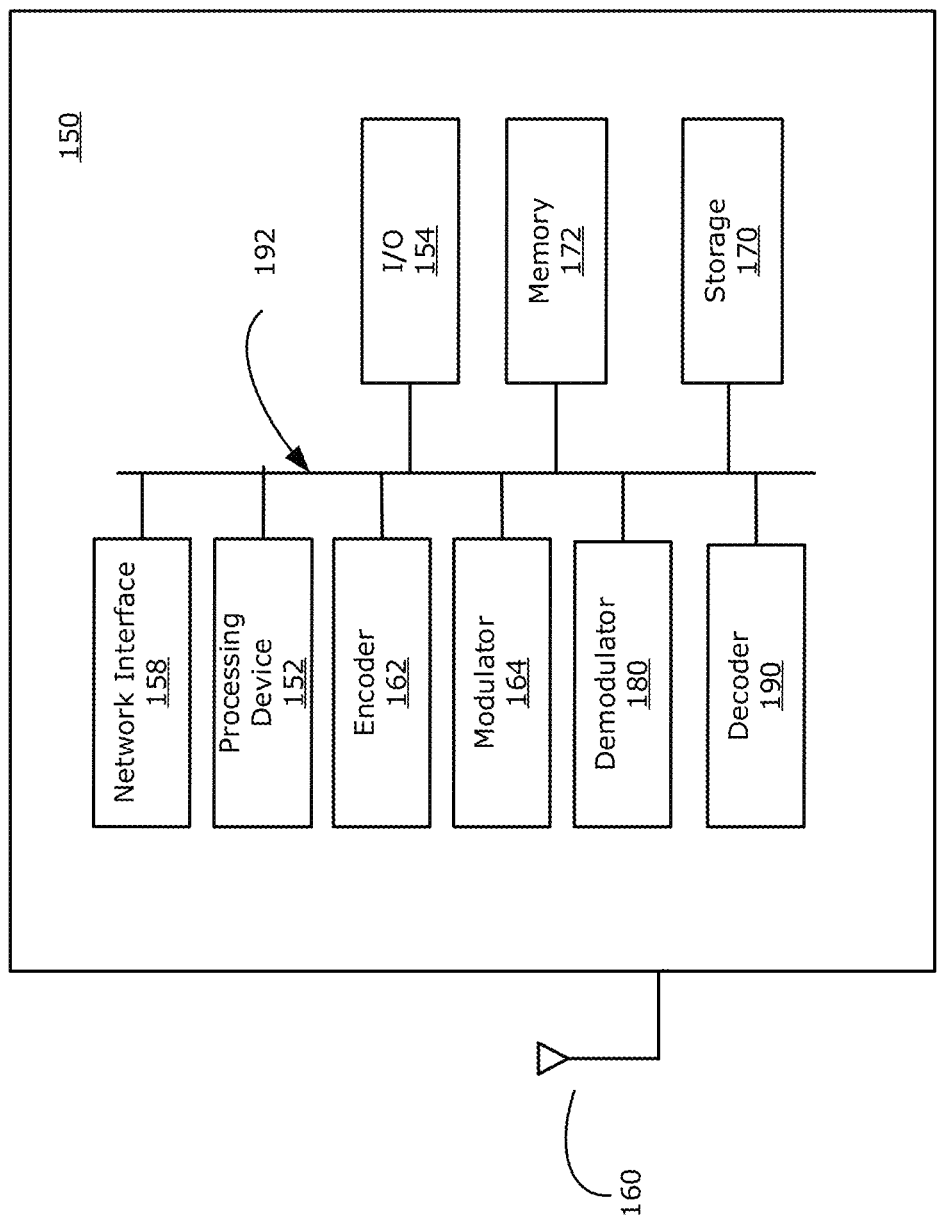
FIG. 1B is a block diagram illustrating an example processing system in accordance with one implementation of the present disclosure.

FIG. 1B illustrates an example processing system 150, which may be used to implement methods and systems described herein, such as the STA 102 or the AP 104. The processing system 150 may be a base station, a wireless router, a mobile device, for example, or any suitable processing system. Other processing systems suitable for implementing the present disclosure may be used, which may include components different from those discussed below. Although FIG. 1B shows a single instance of each component, there may be multiple instances of each component in the processing system 150.

The processing system 150 may include one or more processing devices 152, such as a processor, a microprocessor, an application-specific integrated circuit (ASIC), a field-programmable gate array (FPGA), a dedicated logic circuitry, or combinations thereof. The processing system 150 may also include one or more input/output (I/O) interfaces 154, which may enable interfacing with one or more appropriate input devices and/or output devices (not shown). One or more of the input devices and/or output devices may be included as a component of the processing system 150 or may be external to the processing system 150. The processing system 150 may include one or more network interfaces 158 for wired or wireless communication with a network, such as but not limited to, an intranet, the Internet, a P2P network, a WAN, LAN, a WLAN and/or a cellular or mobile communications network such as a 5G, 4G, LTE or other network as noted above. The network interface(s) 208 may include wired links (e.g., Ethernet cable) and/or wireless links (e.g., one or more radio frequency links) for intra-network and/or inter-network communications. The network interface(s) 158 may provide wireless communication via one or more transmitters or transmitting antennas, one or more receivers or receiving antennas, and various signal processing hardware and software, for example. In this example, a single antenna 160 is shown, which may serve as both transmitting and receiving antenna. However, in other examples there may be separate antennas for transmitting and receiving. The network interface(s) 158 may be configured for sending and receiving data to the backhaul network 110 or to other user devices, access points, reception points, transmission points, network nodes, gateways or relays (not shown) in the network 100.

The processing system 150 may also include one or more storage units 170, which may include a mass storage unit such as a solid state drive, a hard disk drive, a magnetic disk drive and/or an optical disk drive. The processing system 150 may include one or more memories 172, which may include a volatile or non-volatile memory (e.g., a flash memory, a random access memory (RAM), and/or a read-only memory (ROM)). The non-transitory memory(ies) 172 may store instructions for execution by the processing device(s) 152, such as to carry out the present disclosure. The memory(ies) 172 may include other software instructions, such as for implementing an operating system and other applications/functions. In some examples, one or more data sets and/or module(s) may be provided by an external memory (e.g., an external drive in wired or wireless communication with the processing system 150) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

In example embodiments the processing system 150 includes an encoder 162 for encoding source words to codewords and a modulator 164 for modulating codewords to symbols. As explained below, the encoder 162 performs LDPC encoding on source words to generate codewords in bits. The modulator 164 performs modulation on the codewords (e.g., by modulation techniques such as BPSK, QPSK, 16QAM, or 64QAM). In some examples, instructions coded in the memory 172 may configure processing device 152 to perform the functions of the encoder 162 and/or the modulator 164, such that the encoder 162 and/or the modulator 164 may not be distinct physical modules of the processing system 150. In some examples, the encoder 162 and the modulator 164 may be embodied within a transmitter module in the processing system 150. In some examples, the transmitting antenna 160, the encoder 162, and the modulator 164 may be embodied as a transmitter component external to the processing system 150, and may simply communicate the source words from the processing system 150.

The processing system 150 may include a demodulator 180 and a decoder 190, for processing a received signal. The demodulator 180 may perform demodulation on a received modulated signal (e.g., a BPSK, QPSK, 16QAM, or 64QAM signal). The decoder 190 may then perform appropriate decoding on the demodulated signal, in order to recover the original signal contained in the received signal. In some examples, instructions coded in the memory 172 may configure processing device 152 to perform the functions of the demodulator 180 and/or the decoder 190, such that the demodulator 180 and/or the decoder 190 may not be distinct physical modules of the processing system 150. In some examples, the demodulator 180 and the decoder 190 may be embodied within a receiver module in the processing system 150. In some examples, the receiving antenna 160, demodulator 180 and decoder 190 may be embodied as a receiver component external to the processing system 150, and may simply communicate the signal decoded from the received signal to the processing system 150.

There may be a bus 192 providing communication among components of the processing system 150, including the processing device(s) 152, I/O interface(s) 154, network interface(s) 158, encoder 162, modulator 164, storage unit(s) 170, memory(ies) 172, demodulator 180 and decoder 190. The bus 192 may be any suitable bus architecture including, for example, a memory bus, a peripheral bus or a video bus.

Communications between the STA 102 and the AP 104 in the network 100 may be implemented by encoding source words to be transmitted using low density parity check (LDPC) encoding techniques, and/or by decoding codewords received using LDPC code decoding techniques. After source words are encoded with LDPC encoding techniques, when the encoded codewords are transmitted in a signal from the AP 104 to the STA 102 or from the STA 102 to the AP 104, the LDPC encoding information of the transmitted signal may be included in the frame transmitted. After the transmitted signal is received by the STA 102 or the AP 104, with the LDPC encoding information of the received signal, the STA 102 or the AP 104 may then select appropriate LDPC decoding technologies to decode the received signal.

Figure 2A:
FIG. 2A is a diagram illustrating an example single carrier frame format of 802.11ad.

FIG. 2A shows an example format of a single carrier (SC) frame 201 according to the IEEE 802.11ad, which may be used for signals exchanged between the AP 104 and the STA 102 in example embodiments. The SC frame 201, includes short training field (STF), channel estimation (CE) field, PHY Header, SC data blocks (BLK) and optional automatic gain control (AGC) and TRN-R/T subfields for beam forming training. The frame may include a plurality SC data blocks BLK, as shown in FIG. 2A.

Figure 2B:
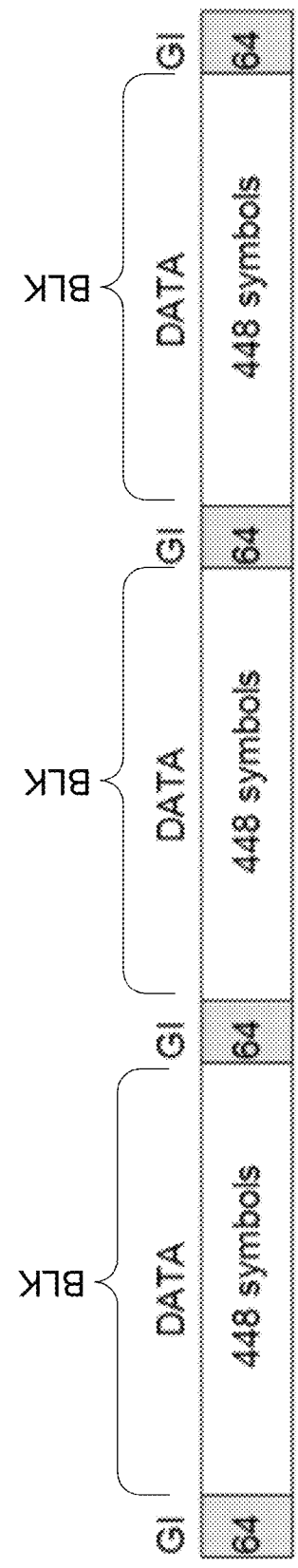
FIG. 2B is a diagram illustrating an example structure of data blocks of the single carrier frame format of 802.11ad.

FIG. 2B illustrates an example construction of SC data blocks BLK according to the 802.11ad standard, which may be used in example embodiments. In FIG. 2B, each SC data block BLK consists of DATA_BLK=448 symbols. A GI=64 bit guard interval (GI) is used between every two adjacent BLKs to play a role as cyclic period between adjacent data blocks to allow a SC receiver to perform frequency-domain equalization. In 802.11ay, channel bonding can be supported, with the number of channels be denoted by NCB, and data blocks sizes modified accordingly. Thus, in example embodiments, other alternative data block and guard interval sizes include: 1) DATA_BLK=448*NCB, GI=64*NCB where 2≤NCB≤N; N≥2) DATA_BLK=480*NCB, GI=32*NCB where 1≤NCB≤N, N≥1; and 3) DATA_BLK=384*NCB, GI=128*NCB where 1≤NCB≤N, N≥1.

FIG. 2A represents an example implementation of a transmitter 300 of the STA 102 or the AP 104. In example embodiments the transmitter 300 outputs SC data frames 201. As specified in the IEEE 802.11ad standard, the PHY Header of SC frame 201 includes a 5 bit MCS field that identifies the MCS applied to the SC data blocks BLK that are included in the SC frame 201. In particular the MCS field is an index into a Modulation and Coding Scheme Table that identifies a set of parameters associated with the index values that are applied to a predetermined modulation and encoding scheme. In the IEEE 802.11ad standard, the MCS index "1" (referred to as MCS 1) specifies the following MCS parameters: Modulation: $\pi/2$-BPSK; $N_{CBPS}=1$; Repetition=2; Code rate=1/2; and Data rate (Mbps)=385. The parameters are specified in respect of a predetermined LDPC encoding process that is set out in Section 21.6.3.2.3.3 of the IEEE 802.11ad standard [REF 2]. As noted above, the IEEE 802.11ad standard specifies a 1/2 rate codeword size of 672 bits.

Accordingly, example embodiments are described herein for a replacement for MCS 1 that is suitable for a 1/2 rate LPDC with a codeword size of 1344 bits, for use in the context of LDPC codes such as set out in "IEEE 802.11-16/0676-01-00 'Length-1344-LDPC-codes-for-11ay', 2016 May 17" [REF 1].

Figure 3A:
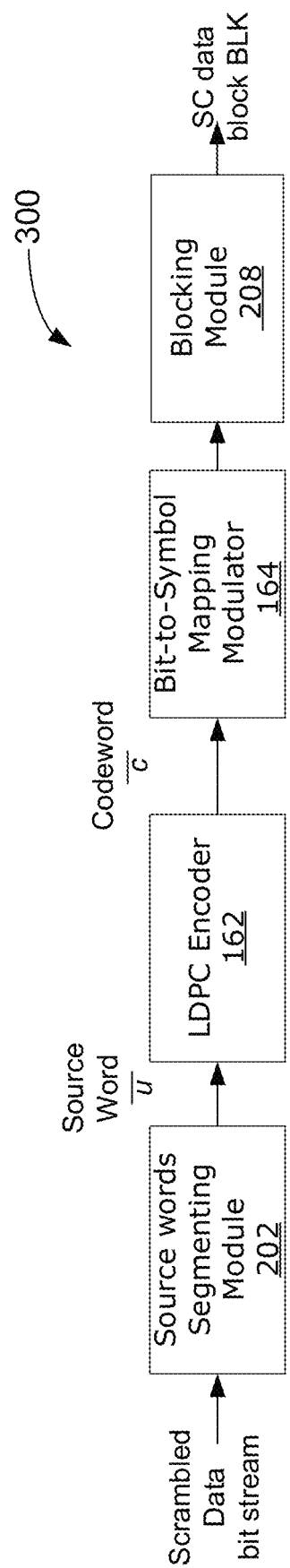
FIG. 3A is a block diagram representing an example implementation of a transmitter of the present disclosure.

A description of an MCS applied to SC data blocks BLK in a SC frame 201 will now be described in the context of FIGS. 3A and 3B. As shown in FIG. 3A, the transmitter 300, which is implemented by processing system 150, includes a source words segmenting module 202, a LDPC encoder 162, a bit-to-symbol mapping modulator 164, and a blocking module 208. In example embodiment the MCS index value in the Header of the frame 201 transmitted from transmitter 300 will correspond to a MCS table entry that includes the MCS parameters: Modulation: $\pi/2$-BPSK; $N_{CBPS}=1$; Repetition=2; Code rate=1/2; and Data rate (Mbps)=385

Figure 3B:
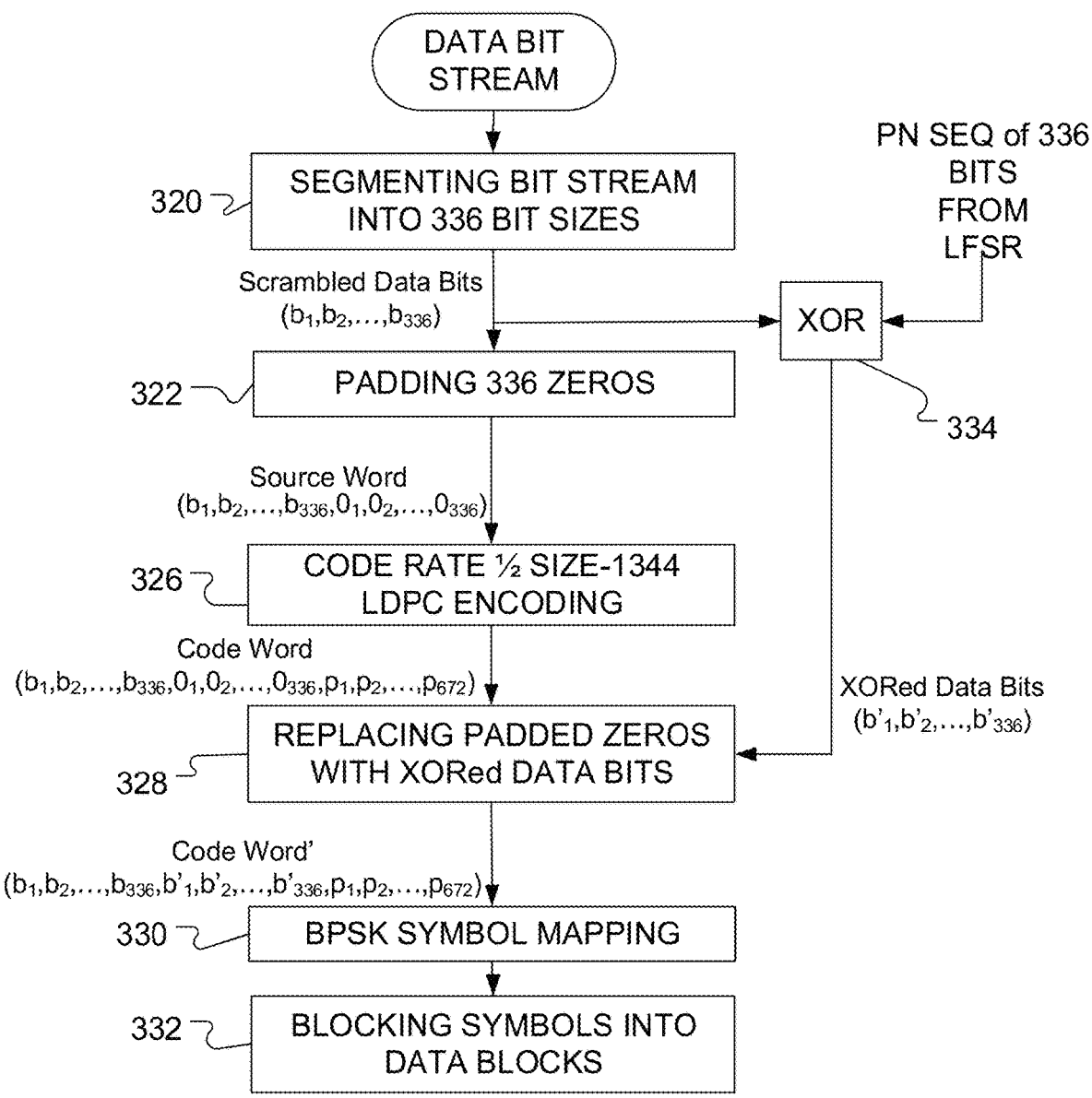
FIG. 3B is a block diagram illustrating example steps in a method of processing an information bit stream of the present disclosure.

FIG. 3B illustrates example steps of processing input information bit stream by the transmitter.

In an example embodiment, scrambled information or data bits are received in a stream at a source words segmenting module 202 that is used to segment the data bits into source words $\bar{u}$ that each have a size of k=672 bits. In the example embodiment the MCS repetition factor of 2 indicates that each source word $\bar{u}$ will include two versions of the input data bits, and accordingly segmenting module 202 performs the following actions (see FIG. 3B) to generate source words $\bar{u}$: (1) the input scrambled data bits are segmented to provide segments that contain k/2=336 scrambled data bits ($b_1, b_2, \ldots, b_{336}$) (step 320); and (2) K/2=336 padding "zero" bits ($0_1, 0_2, \ldots, 0_{336}$) are concatenated with the 336 scrambled data bits to pad up to k bits (step 322) to produce a 672 bit source word $\bar{u}=(b_1, b_2, \ldots, b_{336}, 0_1, 0_2, \ldots, 0_{336})$ (step 326).

Source words $\bar{u}=(b_1, b_2, \ldots, b_{336}, 0_1, 0_2, \ldots, 0_{336})$ of k=672 each from a 1×k row vector or a one-dimensional binary 1×k. The k=672 bit source words $\bar{u}$ are encoded at LDPC encoder 162 to generate respective n=1344 bit codewords $\bar{c}$ by LDPC encoder 162 (step 224). In particular, the 672 bit size block of data bits and padding bits of each source word $\bar{u}=(b_1, b_2, \ldots, b_{336}, 0_1, 0_2, \ldots, 0_{336})$ is concatenated with a n−k=672 bit size block of parity bits ($p_1, p_2, \ldots, p_{672}$) to create n=1344 bit size codeword $\bar{c}=(b_1, b_2, \ldots, b_{336}, 0_1, 0_2, \ldots, 0_{336}, p_1, p_2, \ldots, p_{672})$ such that $H\bar{c}^T=0$, where H is an (n−k)×n parity check matrix.

Figure 5:
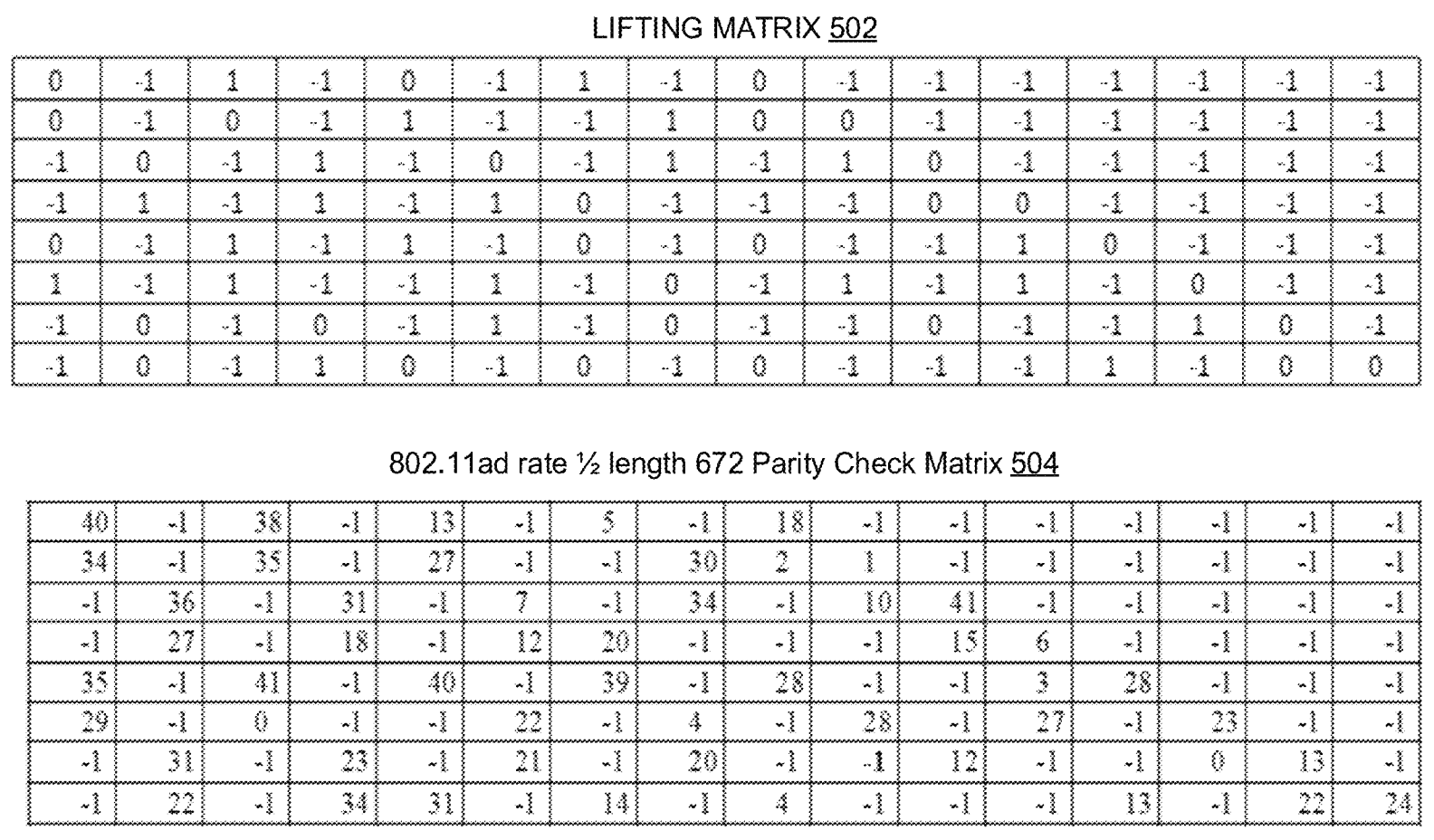

In an example embodiment, the parity matrix H takes the form of rate 1/2 length 1344 LDPC matrix specified in "IEEE 802.11-16/0676-01-00 'Length-1344-LDPC-codes-for-11ay', 2016 May 17" [REF 1]. In this regard, referring to FIG. 5, parity matrix H is the 672 row by 1344 column matrix that results from applying lifting matrix 592 to base matrix 504, which is the code rate=1/2, codeword size=672 bit LDPC matrix specified in IEEE 802.11ad [REF2]. In base matrix 504, each element i in the table that contains a value other than "−1" is the cyclic permutation matrix P, of an identify matrix P, of size Z×Z where Z=42, and "−1" entries represent the zero matrix of size Z×Z.

Figure 4:
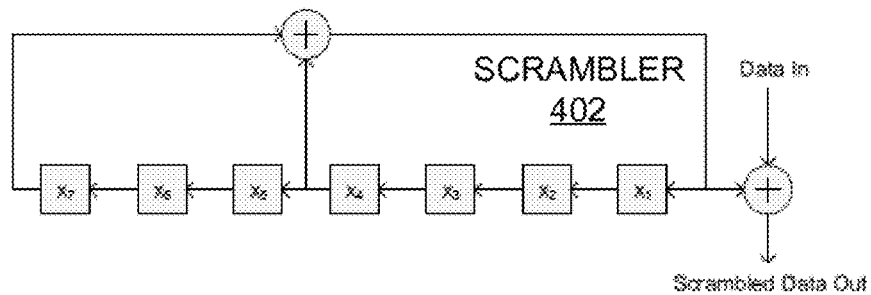
FIG. 4 is a block diagram representing a scrambler.

The encoded n=1344 size codeword $\bar{c}=(b_1, b_2, \ldots, b_{336}, 0_1, 0_2, \ldots, 0_{336}, p_1, p_2, \ldots, p_{672})$ is subjected to a further operation at LDPC encoder 162 in that the k/2=336 padding zero bits $(0_1, 0_2, \ldots, 0_{336})$ are replaced with XORed data bits (step 328). In particular, the 336 original scrambled data bits $(b_1, b_2, \ldots, b_{336})$ are XORed with a 336 bit size pseudorandom number (PN) sequence to produce a 336 bit block of PN sequence XORed data bits $(b'_1, b'_2, \ldots, b'_{336})$. In this regard, FIG. 4 shows an example of a scrambler 402 implemented using a linear feedback shift register (LFSR) and XOR operation. The PN sequence could for example be generated from the LFSR of scrambler 402, with the LSFR being initialized to the all ones vector and reinitiated to the same vector after every codeword. After the replacement of padded zeros with XORed data bits, the LDPC encoder outputs 1344 bit size codewords $\bar{c}=(b_1, b_2, \ldots, b_{336}, b'_1, b'_2, \ldots, b'_{336}, p_1, p_2, \ldots, p_{672})$ that comprise 336 scrambled data bits, 336 scrambled data bits XORed with a PN sequence, and 672 parity check bits.

The encoded codewords $\bar{c}'$ are then modulated to symbols at bit-to-symbol mapping modulator 164 (step 330). In example embodiments π/2 BPSK modulation specified in 802.11ad is applied. In BPSK modulation, binary bits are simply mapped to be bipolar {−1, 1} symbols. A plurality of the symbols may be grouped as a modulated codewords. For example, the modulated codewords may include 1344 BPSK modulated symbols. The modulated codewords may be further assembled into data blocks (BLK) with appropriate size in the blocking module 208 (step 332). In an embodiment, each assembled data block BLK contain 448 symbols. The data blocks BLK can then be assembled into a frame 201, which in some examples is IEEE 802.11ay SC compliant frame, and modulated onto a single carrier for transmission to a receiver that has a corresponding decoding capabilities.

In some examples, the blocking module 208 is configured to apply orthogonal frequency divisional multiplexing (OFDM) to the BPSK modulated symbols to output OFDM symbol blocks that can be assembled into an IEEE 802.11ay OFDM compliant frame.

Accordingly, the MCS described above provides a suitable coding procedure for 802.11ay MCS 1 using a rate 1/2 LDPC code of size 1344. In example simulations, a performance gain of up to 0.5 dB has been observed compared to using rate 1/2 size 672 LDPC code with MCS 1 specified in 802.11ad.

The present disclosure provides certain example algorithms and calculations for implementing examples of the disclosed methods and systems. However, the present disclosure is not bound by any particular algorithm or calculation. Although the present disclosure describes methods and processes with steps in a certain order, one or more steps of the methods and processes may be omitted or altered as appropriate. One or more steps may take place in an order other than that in which they are described, as appropriate.

Through the descriptions of the preceding embodiments, the present invention may be implemented by using hardware only, or by using software and a necessary universal hardware platform, or by a combination of hardware and software. Based on such understandings, the technical solution of the present invention may be embodied in the form of a software product. The software product may be stored in a non-volatile or non-transitory storage medium, which can be a compact disk read-only memory (CD-ROM), USB flash drive, or a hard disk. The software product includes a number of instructions that enable a computer device (personal computer, server, or network device) to execute the methods provided in the embodiments of the present invention.

Although the present invention and its advantages have been described in detail, it should be understood that various changes, substitutions and alterations can be made herein without departing from the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method for electronically encoding a source word for wireless transmission, comprising:
    segmenting a stream of data bits into 336 bit size segments;
    adding 336 padding bits to each 336 bit size segment to generate corresponding 672 bit size source words;
    applying a 1/2 rate low density parity check (LDPC) coding to each 672 bit size source word to generate a corresponding 1344 bit size codeword that includes 672 parity bits;
    for each codeword, substituting the 336 padding bits with 336 bits derived from the data bits included in the codeword, to provide a 1344 bit size codeword that includes a concatenation of the 336 data bits, the 336 bits derived from the data bits, and 672 parity bits; and
    wirelessly transmitting, at a transmitter, a signal including the generated 1344 bit size codewords.

2. The method of claim 1 wherein the stream of data bits are scrambled.

3. The method of claim 1 wherein the padding bits are zero bits.

4. The method of claim 1 wherein applying LDPC coding to each 672 bit size source word comprises applying the rate 1/2 length 1344 LDPC matrix specified in "IEEE 802.11-16/0676-01-00 'Length-1344-LDPC-codes-for-11ay', 2016 May 17" standard.

5. The method of claim 1 wherein substituting the 336 padding bits comprises replacing each padding bit with a data bit that has been XORed with a bit from a pseudorandom number (PN) sequence.

6. The method of claim 1 comprising mapping the codewords to Binary Phase Shift Keying (BPSK) symbols.

7. The method of claim 6 comprising blocking the BPSK symbols into data blocks and assembling the data blocks into an 802.11ay compliant frame for single carrier transmission.

8. The method of claim 6 further comprising modulating the BPSK symbols into orthogonal frequency division multiplex (OFDM) symbol blocks for OFDM transmission.

9. A system for electronically encoding a source word for wireless transmission, comprising:
    a memory storing instructions; and
    a processor configured, by the instructions, to:
        segment a stream of data bits into 336 bit size segments; and
        add 336 padding bits to each 336 bit size segment to generate corresponding 672 bit size source words;

apply a 1/2 rate low density parity check (LDPC) coding to each 672 bit size source word to generate a corresponding 1344 bit size codeword that includes 672 parity bits;

for each codeword, substitute the 336 padding bits with 336 bits derived from the data bits included in the codeword, to provide a 1344 bit size codeword that includes a concatenation of the 336 data bits, the 336 bits derived from the data bits, and 672 parity bits; and wirelessly transmit, at a transmitter, a signal including the generated 1344 bit size codewords.

10. The system of claim 9 wherein the stream of data bits are scrambled.

11. The system of claim 9 wherein the padding bits are zero bits.

12. The system of claim 9 wherein the processor is configured to apply the rate 1/2 length 1344 LDPC matrix specified in "IEEE 802.11-16/0676-01-00 'Length-1344-LDPC-codes-for-11ay', 2016 May 17" standard.

13. The system of claim 9 wherein the processor is configured to substitute the 336 padding bits by replacing each padding bit with a data bit that has been XORed with a bit from a pseudorandom number (PN) sequence.

14. The system of claim 9 the processor is further configured to map the codewords to Binary Phase Shift Keying (BPSK) symbols.

15. The system of claim 14 the processor is further configured to block the BPSK symbols into data blocks and assemble the data blocks into an 802.11ay compliant frame for transmission using a single carrier.

16. The system of claim 14 the processor is further configured to modulate the BPSK symbols into orthogonal frequency division multiplex (OFDM) symbol blocks for OFDM transmission.

17. The system of claim 9 wherein the system is embodied in a local wireless area network access point.

18. The system of claim 9 wherein the system is embodied in a mobile wireless station.

* * * * *